(12) United States Patent
Mao et al.

(10) Patent No.: US 11,393,715 B2
(45) Date of Patent: Jul. 19, 2022

(54) METHOD FOR MANUFACTURING A 14NM-NODE BEOL 32NM-WIDTH METAL

(71) Applicant: Shanghai Huali Integrated Circuit Corporation, Shanghai (CN)

(72) Inventors: Yongji Mao, Shanghai (CN); Ronghong Ye, Shanghai (CN); Liyao Liu, Shanghai (CN); Yu Zhang, Shanghai (CN); Zhanyuan Hu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 155 days.

(21) Appl. No.: 16/854,075

(22) Filed: Apr. 21, 2020

(65) Prior Publication Data

US 2021/0098282 A1    Apr. 1, 2021

(30) Foreign Application Priority Data

Sep. 30, 2019  (CN) .......................... 201910938330.8

(51) Int. Cl.
*H01L 21/768*    (2006.01)
*H01L 21/027*    (2006.01)
*H01L 21/311*    (2006.01)

(52) U.S. Cl.
CPC .... *H01L 21/76802* (2013.01); *H01L 21/0276* (2013.01); *H01L 21/31111* (2013.01); *H01L 21/31144* (2013.01)

(58) Field of Classification Search
CPC .......... H01L 21/76802; H01L 21/0276; H01L 21/31111; H01L 21/31144; H01L 21/76816; H01L 21/0338
See application file for complete search history.

(56) References Cited

U.S. PATENT DOCUMENTS

| | | | | |
|---|---|---|---|---|
| 7,199,046 B2* | 4/2007 | Wetzel | .............. | H01L 21/76813 438/637 |
| 7,838,432 B2* | 11/2010 | Wang | ................ | H01L 21/76816 438/714 |
| 8,367,540 B2* | 2/2013 | Lin | ..................... | H01L 21/3105 438/618 |
| 9,431,295 B2* | 8/2016 | Lin | ..................... | H01L 21/3105 |
| 9,449,871 B1* | 9/2016 | Bergendahl | ....... | H01L 21/76831 |

(Continued)

*Primary Examiner* — Bac H Au
(74) *Attorney, Agent, or Firm* — Banner & Witcoff, Ltd.

(57) ABSTRACT

Provided is a method for manufacturing a 14 nm-node BEOL 32 nm-width metal. A semiconductor structure for manufacturing BEOL wire is provided, wherein the semiconductor structure at least comprises a carbon coating and intermediate layer on it; forming a photoresist layer on the intermediate layer and exposing the photoresist layer according to a layout; developing the exposed photoresist layer by using a developing solution, and causing the developed photoresist to react with the intermediate layer in a contact region of the developed photoresist to form a peg groove; and etching by using the groove in the semiconductor structure to form a 14 nm-node BEOL 32 nm-width metal. This application can reducing the longitudinal shrink of the metal wire, achieving the improvement of the lateral and longitudinal shrink uniformity, reducing defects caused by misalignment of the through hole and the metal wire, and increasing the effective usable area of a chip.

10 Claims, 7 Drawing Sheets

(56) References Cited

U.S. PATENT DOCUMENTS

| | | | |
|---|---|---|---|
| 9,627,318 B2* | 4/2017 | Lin | H01L 21/76816 |
| 10,679,892 B1* | 6/2020 | Mignot | H01L 21/76837 |
| 10,686,124 B2* | 6/2020 | Yang | H01L 43/12 |
| 10,777,735 B2* | 9/2020 | Yang | H01L 21/76816 |
| 2003/0124863 A1* | 7/2003 | Hwang | H01L 21/0217 |
| | | | 438/694 |
| 2005/0104150 A1* | 5/2005 | Wetzel | H01L 21/7681 |
| | | | 257/437 |
| 2008/0254638 A1* | 10/2008 | Wang | H01L 21/31144 |
| | | | 438/717 |
| 2009/0087992 A1* | 4/2009 | Srivastava | H01L 21/76816 |
| | | | 438/701 |
| 2010/0120253 A1* | 5/2010 | Jeng | H01L 21/31144 |
| | | | 438/702 |
| 2011/0115090 A1* | 5/2011 | Lin | H01L 21/31144 |
| | | | 257/750 |
| 2013/0323641 A1* | 12/2013 | Chang | G03F 7/0046 |
| | | | 430/270.1 |
| 2014/0175617 A1* | 6/2014 | Antonelli | H01L 21/67259 |
| | | | 257/632 |
| 2015/0364420 A1* | 12/2015 | Lin | H01L 24/05 |
| | | | 257/775 |
| 2017/0194195 A1* | 7/2017 | Cohen | H01L 21/76802 |
| 2019/0148287 A1* | 5/2019 | Chang | H01L 27/088 |
| | | | 257/368 |
| 2019/0164820 A1* | 5/2019 | Sun | H01L 21/76837 |
| 2019/0237356 A1* | 8/2019 | Srivastava | H01L 23/528 |
| 2020/0083436 A1* | 3/2020 | Yang | H01L 43/12 |
| 2021/0098282 A1* | 4/2021 | Mao | H01L 21/76802 |
| 2021/0335661 A1* | 10/2021 | Chen | H01L 21/76802 |

* cited by examiner

METHOD FOR MANUFACTURING A 14NM-NODE BEOL 32NM-WIDTH METAL

CROSS REFERENCE TO RELATED APPLICATIONS

The present application claims priority to and the benefit of Chinese Patent Application No. 201910938330.8 filed on Sep. 30, 2019, the disclosure of which is incorporated herein by reference in its entirety as part of the present application.

BACKGROUND

The present invention relates to the field of semiconductor manufacturing, and in particular to a method for manufacturing a 14 nm-node BEOL 32 nm-width metal.

Because the 193 nm DUV lithography technology cannot meet the fine-pitch patterns required by the 14 nm, 10 nm, and 7 nm node technologies, a double-patterning technology was developed to achieve fine-pitch patterning. The design rule for the 14 nm-node BEOL metal line layout requires a pitch of 64 nm; in the case of a double-patterning method, the exposure CD (critical dimension) is maintained at 53 nm, and the CD is reduced to 30 nm by a metal hard mask etch. Double-patterning is completed through two masks to obtain a 64 nm-pitch metal wire.

Figure 1A:
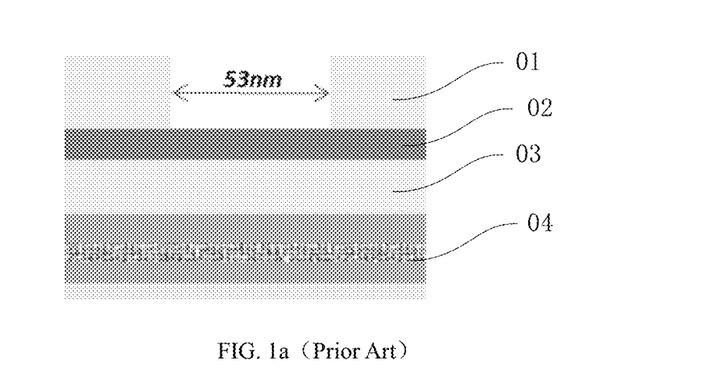
FIG. 1a and FIG. 1c are schematic diagrams showing a process flow of shrink of the 14 nm-node BEOL metal in the prior art.
Figure 1B:
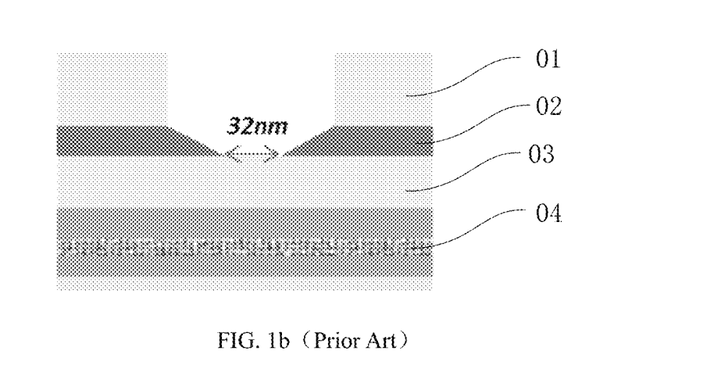
FIG. 1b is a schematic diagram showing the lateral and longitudinal shrinks of a 14 nm-node BEOL 32 nm-width metal in the prior art.
Figure 1C:
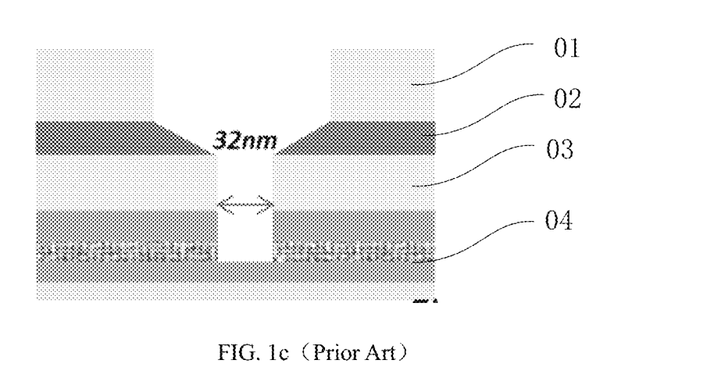

The CD reduction process of the 14 nm-node 64 nm-pitch (width: 32 nm; width distance: 32 nm) BEOL metal is implemented as follows: as shown in FIG. 1a to FIG. 1c. FIG. 1a provides a carbon coating 03 and an intermediate layer 02 on the carbon coating 03, where a laminated structure 04 is disposed under the carbon coating 03. After exposure and development, the groove width after the development of the photoresist 01 is 53 nm. As shown in FIG. 1b, the bottom anti-reflection coating SHB (the intermediate layer 02) is then etched, and the bottom width of the SHB is formed to be 32 nm, and its top width is the same as the width of 53 nm after the development of the photoresist. As shown in FIG. 1c, the laminated structure is then etched according to a width of 32 nm to form a reduced CD.

Figure 2A:
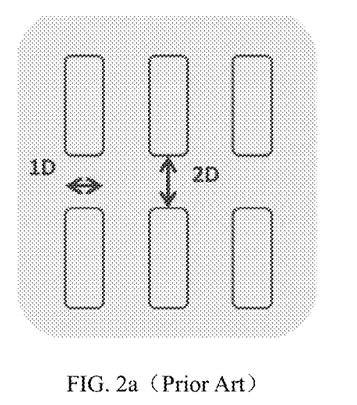
FIG. 2a is a schematic diagram showing different degrees of shrinks of the 14 nm-node BEOL metal in the prior art in the 1D and 2D directions.
Figure 2B:
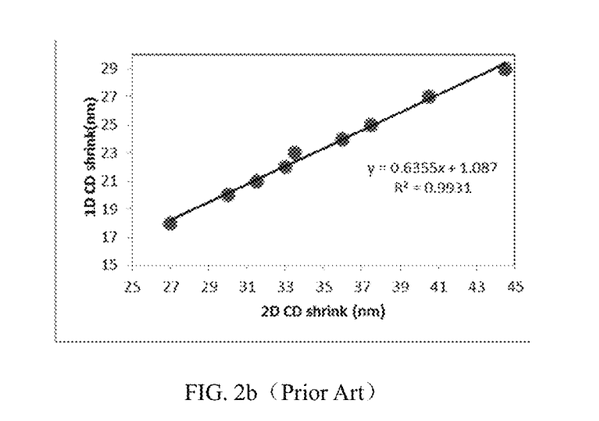
FIG. 2b is a 1D/2D linear relationship diagram of shrink of the 14 nm-node BEOL metal in the prior art.
Figure 3:
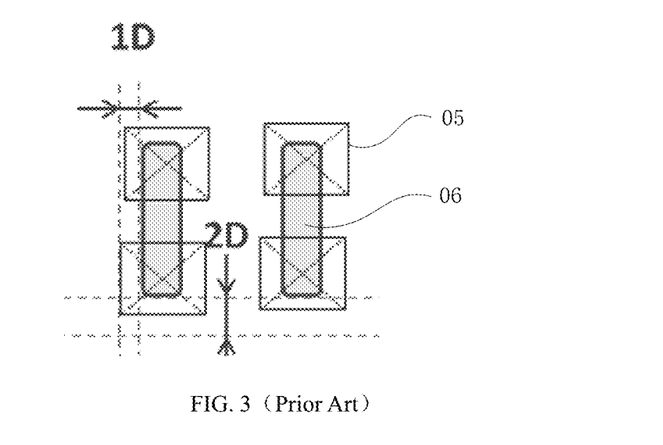
FIG. 3 is a schematic diagram showing the misalignment with the through hole due to different degrees of shrinks of the 14 nm-node BEOL metal in the prior art in the 1D and 2D directions.

As shown in FIG. 2a, in the prior art, the 14 nm-node BEOL metal wire after the CD reduction generates different degrees of shrinks in the lateral (1D) and longitudinal (2D) directions; referring to FIG. 2b, the experimental results show that the ratio of 1D to 2D is about 0.63, which means that the lateral (1D) shrink of the metal wire by 1 nm will result in the longitudinal (2D) shrink of the metal wire by 1.56 nm. It can be seen that the huge gap between the lateral and longitudinal shrinks will lead to the misalignment of the metal wire and the through hole (as shown in FIG. 3). Although it can be compensated by OPC (Optical Proximity Correction) technology, the limitations of the chip area pose challenges to the OPC technology.

Therefore, a new method is needed to solve the above problems.

BRIEF SUMMARY

In view of the shortcomings of the prior art described above, an object of the present invention is to provide a method for manufacturing a 14 nm-node BEOL 32 nm-width metal, which is used to solve the problem in the prior art that defects are caused by misalignment of the metal wire and the through hole because the fact that the 14 nm-node BEOL metal wire after the CD reduction generates different degrees of shrinks in the lateral and longitudinal directions;

In order to achieve the above object and other related objects, the present invention provides a method for manufacturing a 14 nm-node BEOL 32 nm-width metal. The method at least includes the following steps: step 1, providing a semiconductor structure for manufacturing a BEOL metal wire, wherein the semiconductor structure at least includes a carbon coating and an intermediate layer on the carbon coating; step 2, forming a photoresist layer on the intermediate layer and exposing the photoresist layer according to a layout; step 3, developing the exposed photoresist layer by using a developing solution, and causing the developed photoresist to react with the intermediate layer in the contact region of the developed photoresist to form a peg groove; and step 4, etching by using the groove in the semiconductor structure to form a 14 nm-node BEOL 32 nm-width metal.

Preferably, the semiconductor structure includes a laminated structure under the carbon coating.

Preferably, the laminated structure comprises, from bottom to top, a carbon-containing silicon nitride layer, a first nitrogen-free anti-reflection coating, a TiN layer, and a second nitrogen-free anti-reflection coating.

Preferably, the thickness of the carbon coating in step 1 is 1800 angstroms.

Preferably, the intermediate layer in step 1 is a bottom anti-reflection layer.

Preferably, the thickness of the bottom anti-reflection layer is 330 angstroms.

Preferably, the thickness of the photoresist layer formed on the intermediate layer in step 2 is 750 angstroms.

Preferably, the thickness of the carbon-containing silicon nitride layer in the laminated structure is 100 angstroms.

Preferably, the thickness of the first nitrogen-free anti-reflection coating in the laminated structure is 200 angstroms.

Preferably, the thickness of the TiN layer in the laminated structure is 250 Angstroms.

Preferably, the thickness of the second nitrogen-free anti-reflection coating in the laminated structure is 400 angstroms.

Preferably, the peg groove is formed in step 3, its narrow part has a width of 53 nm and its wide part has a width of 59 nm.

Preferably, the method for etching by using the groove in the semiconductor structure to form a 14 nm-node BEOL 32 nm-width metal in step 4 at least includes: (a) etching the intermediate layer according to the width of the bottom of the intermediate layer, so that the width of the exposed carbon coating reaches 32 nm; and (b) etching the laminated structure along the exposed carbon coating to form a 32 nm groove.

As mentioned above, the method for manufacturing a 14 nm-node BEOL 32 nm-width metal of the present invention has the following beneficial effects: a modified bottom anti-reflection layer (BARC) component is used to react with the photoresist contact region after development to form a concave structure at the bottom of the photoresist, thereby reducing the longitudinal (2D) shrink of the metal wire, achieving the improvement of the 1D/2D shrink uniformity, reducing defects caused by misalignment of the through hole and the metal wire, and increasing the effective usable area of a chip.

DETAILED DESCRIPTION

The following describes the embodiments of the present invention through specific examples. Those skilled in the art can easily understand other advantages and effects of the present invention from the content disclosed in this specification. The present invention can also be implemented or applied through different specific embodiments, and various details in this specification can also be modified or changed based on different viewpoints and applications without departing from the spirit of the present invention.

Reference may be made to FIG. 4 to FIG. 8. It should be noted that the illustrations provided in this embodiment only illustrate the basic concept of the present invention in a schematic manner, and thus only the components related to the present invention are shown in the drawings, and the drawings are not made according to the number, shape and size of components during actual implementation. In actual implementation, the type, quantity, and proportion of each component can be changed at will, and the component layout may be more complicated.

Figure 8:
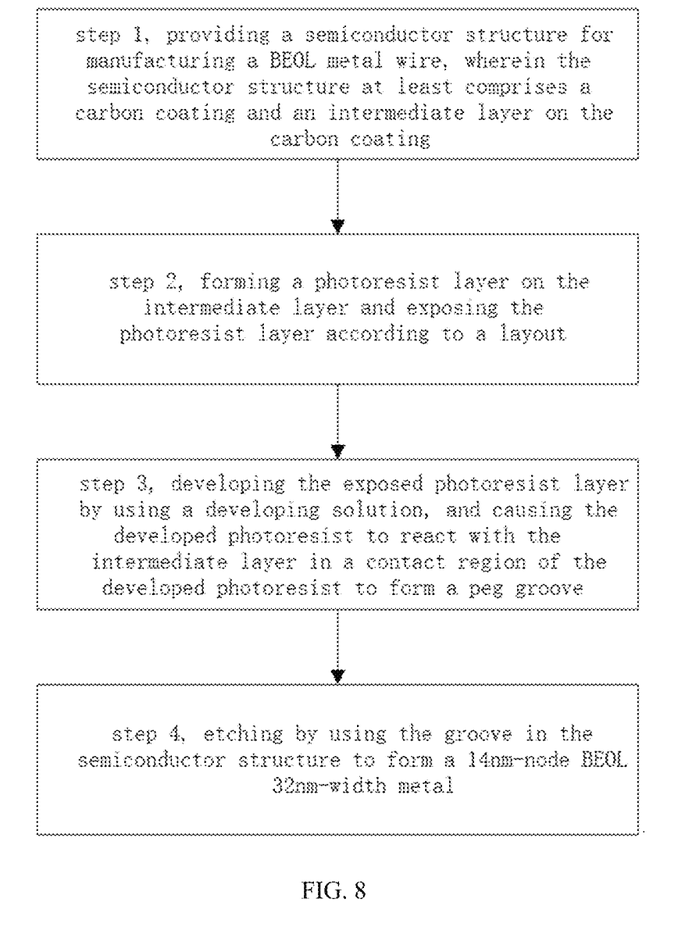
FIG. 8 shows a flowchart of the method for manufacturing a 14 nm-node BEOL 32 nm-width metal in the present invention.

A method for manufacturing a 14 nm-node BEOL 32 nm-width metal is shown in FIG. 8. FIG. 8 shows a flowchart of the method for manufacturing a 14 nm-node BEOL 32 nm-width metal in the present invention. The method at least includes the following steps.

Figure 4:
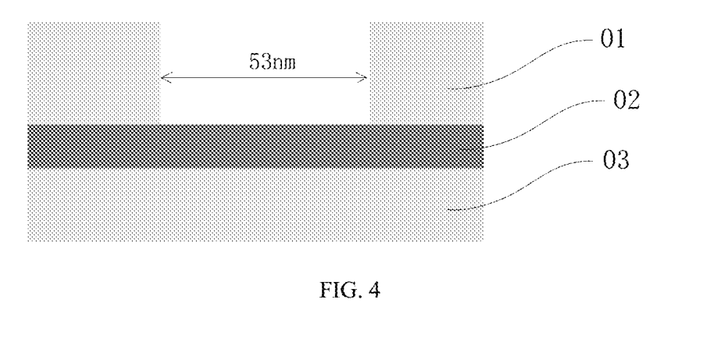
FIG. 4 and FIG. 5a are schematic structure diagrams showing a process of manufacturing a 14 nm-node BEOL metal according to the present invention.

In step 1, a semiconductor structure is provided for manufacturing a BEOL metal wire. As shown in FIG. 4, it is a schematic structure diagram showing a process of manufacturing a 14 nm-node BEOL metal according to the present invention. The semiconductor structure at least includes a carbon coating (Spin On Carbon, SOC) 03 and an intermediate layer (SHB) 02 on the carbon coating 03; in the present invention, the intermediate layer 02 on the carbon coating 03 is disposed to provide a bottom anti-reflection layer for a photoresist 01 thereon.

Furthermore, the semiconductor structure in step 1 includes a laminated structure under the carbon coating. The laminated structure is not shown in FIG. 4 and FIG. 5a, and reference may be made to the laminated structure 04 under the carbon coating 03 in FIG. 1a to FIG. 1c. Furthermore, the thickness of the carbon coating 03 in step 1 is 1800 angstroms. The intermediate layer 02 is a bottom anti-reflection layer. In this embodiment, the thickness of the bottom anti-reflection layer (the intermediate layer 02) is 330 angstroms.

Furthermore, the laminated structure in step 1 comprises, from bottom to top, a carbon-containing silicon nitride layer, a first nitrogen-free anti-reflection coating (NFDARC), a TiN layer, and a second NFDARC. That is, the laminated structure under the carbon coating 03 is composed of a carbon-containing silicon nitride layer, a first NFDARC, a TiN layer, and a second NFDARC, and the second NFDARC is adjacent to the carbon coating 03. The thickness of the carbon-containing silicon nitride layer in the laminated structure in this embodiment is 100 angstroms.

Preferably, the thickness of the second NFDARC in the laminated structure is 400 angstroms. The TiN layer is located on the lower surface of the second NFDARC. In this embodiment, the thickness of the TiN layer is 250 angstroms. Preferably, the first NFDARC is located on the lower surface of the TiN layer which is 250 angstroms thick. Furthermore, the thickness of the first NFDARC in the laminated structure is 200 angstroms.

In step 2, a photoresist layer is formed on the intermediate layer and exposed according to a layout. Referring to FIG. 4 which is a schematic structure diagram showing a process of manufacturing a 14 nm-node BEOL metal according to the present invention. A photoresist is spun on the intermediate layer 02 (the bottom anti-reflection layer) to form a photoresist layer 01, and the photoresist layer 01 is exposed according to a mask pattern.

Furthermore, the thickness of the photoresist layer formed on the intermediate layer (SHB) 02 in step 2 is 750 angstroms.

Figure 5A:
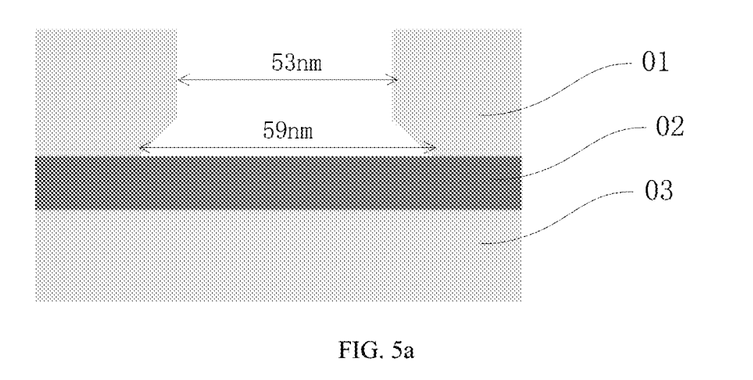
Figure 5B:
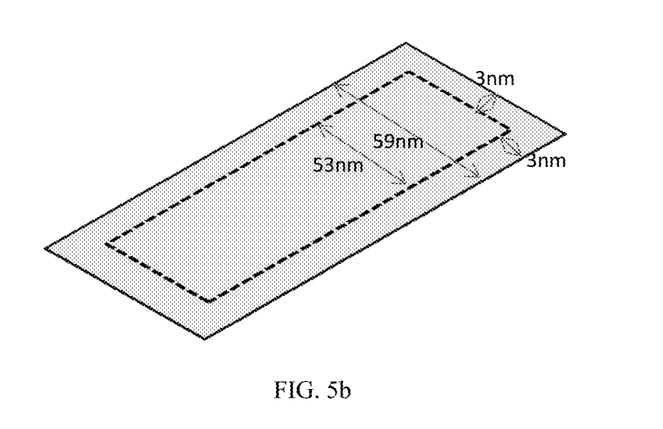
FIG. 5b is a schematic diagram showing the planar dimensions of the peg groove formed by the photoresist etching according to the present invention.

In step 3, the exposed photoresist layer is developed by using a developing solution, and the developed photoresist reacts with the intermediate layer in the contact region of the developed photoresist to form a peg groove. The intermediate layer 02 of the present invention is a photolithographic anti-reflection layer with special properties formed by modifying the BARC in the prior art, and the modified BARC component causes the intermediate layer to react with the developed photoresist (the contact region between BARC and the photoresist) to form a concave structure at the bottom of the photoresist, as shown in FIG. 5a; FIG. 5a shows a schematic diagram of the concave structure formed by the photoresist 01 and the contact region (the bottom of the photoresist 01) with the intermediate layer 02; the photoresist 01 shown in FIG. 4 has been developed but does not form the photoresist concave structure. Furthermore, as shown in FIG. 5a, the peg groove is formed in step 3, its narrow part has a width of 53 nm and its wide part has a width of 59 nm. As shown in FIG. 5b, it is a schematic diagram showing the planar dimensions of the peg groove formed by the photoresist etching according to the present invention; the narrow part of the groove formed is 3 nm less in both the lateral and longitudinal directions than the wide part.

In this step, the concave photoresist structure is formed by using the intermediate layer (the bottom anti-reflection layer) with special properties, so that the shrinks of the subsequently formed 14 nm-node BEOL 32 nm-width metal in the lateral (1D) and longitudinal (2D) directions are consistent. Therefore, defects caused by misalignment of the through hole and the metal wire are reduced and the effective usable area of a chip is increased.

step 4, etching is performed by using the groove in the semiconductor structure to form a 14 nm-node BEOL 32 nm-width metal. Furthermore, the method for etching by using the groove in the semiconductor structure to form a 14 nm-node BEOL 32 nm-width metal at least includes: (a) etching the intermediate layer according to the width of the bottom of the intermediate layer, so that the width of the exposed carbon coating reaches 32 nm; and (b) etching the laminated structure along the exposed carbon coating to form a 32 nm groove.

Figure 1D:
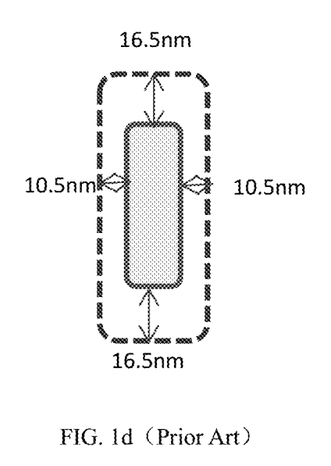
Figure 5C:
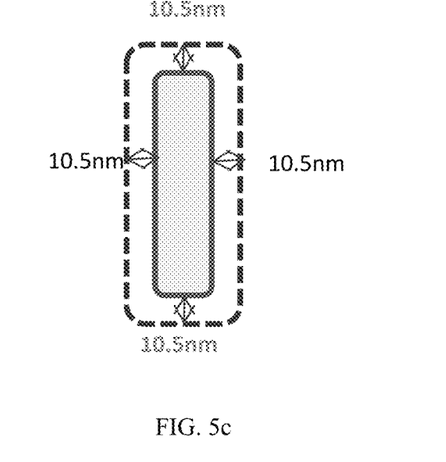
FIG. 5c is a schematic diagram showing the lateral and longitudinal shrinks of the 14 nm-node BEOL 32 nm-width metal manufactured by using the method of the present invention.

During the process of manufacturing the 14 nm-node BEOL 32 nm-width metal, in the case of the plasma etching, the end of the metal wire is bombarded by polysilicon in three directions, which causes the metal wire to shrink more in the longitudinal direction (2D) than in the lateral direction (1D). According to the method of the present invention, in step 4, the bottom of the photoresist is widened to compensate for the longitudinal shrink of the metal wire caused by subsequent etching, so that the shrink ratios in the lateral (1D) direction and the longitudinal (2D) direction are substantially the same. As shown in FIG. 5c, it is a schematic diagram showing the lateral and longitudinal shrinks of the 14 nm-node BEOL 32 nm-width metal manufactured by using the method of the present invention; FIG. 1d is a schematic diagram showing the lateral and longitudinal shrinks of a 14 nm-node BEOL 32 nm-width metal in the prior art; through comparison, it can be seen that the lateral and longitudinal shrinks of the 14 nm-node BEOL 32 nm-width metal manufactured by the method of the present invention are consistent, which are both 10.5 nm; the left and right shrinks of the 14 nm-node BEOL 32 nm-width metal manufactured in the prior art in the lateral (1D) direction are both 10.5 nm, and its left and right shrinks in the longitudinal (2D) direction are both 16.5 nm; therefore, the method of the present invention can improve the problem of the misalignment of the metal wire and the through hole.

Figure 6:
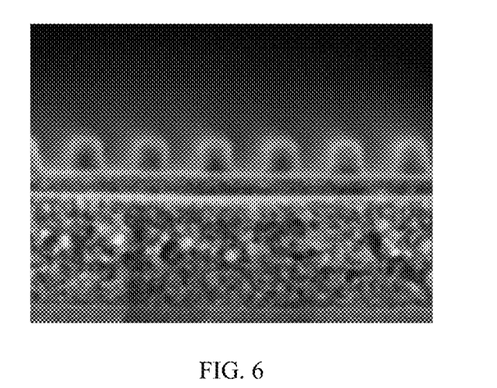
FIG. 6 is an electron microscope image of the 14 nm-node BEOL metal manufactured by using the method of the present invention.
Figure 7:
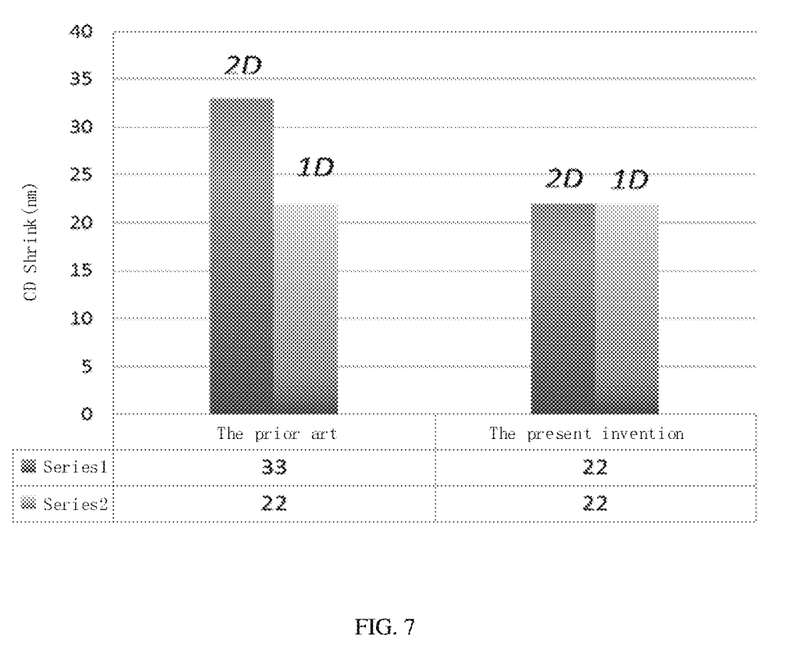
FIG. 7 is a schematic diagram showing the comparison of the shrinks in the 1D and 2D directions between the 14 nm-node BEOL metal manufactured by the method of the present invention and the 14 nm-node BEOL metal manufactured by the method of the prior art.

As shown in FIG. 6, it is an electron microscope image of the 14 nm-node BEOL metal manufactured by using the method of the present invention. As further shown in FIG. 7, it is a schematic diagram showing the comparison of the shrinks in the 1D and 2D directions between the 14 nm-node BEOL metal manufactured by the method of the present invention and the 14 nm-node BEOL metal manufactured by the method of the prior art. The histogram on the left side of FIG. 7 shows the comparison of the shrinks of the 14 nm-node BEOL metal in the prior art in the lateral (1D) and longitudinal (2D) directions. The histogram on the right side of FIG. 7 shows the comparison of the shrinks of the 14 nm-node BEOL metal manufactured by the method of the present invention in the lateral (1D) and longitudinal (2D) directions. After comparison, it is found that the lateral and longitudinal shrinks of the 14 nm-node BEOL metal manufactured by the method of the present invention are the same.

To sum up, according to the present invention, a modified bottom anti-reflection layer (BARC) component is used to react with the photoresist contact region after development to form a concave structure at the bottom of the photoresist, thereby reducing the longitudinal (2D) shrink of the metal wire, achieving the improvement of the 1D/2D shrink uniformity, reducing defects caused by misalignment of the through hole and the metal wire, and increasing the effective usable area of a chip Therefore, the present invention effectively overcomes various shortcomings in the prior art and has high industrial utilization value.

The above-mentioned embodiments merely illustrate the principle of the present invention and its effects, but are not intended to limit the present invention. Any person familiar with this technology can modify or change the above embodiments without departing from the spirit and scope of the present invention. Therefore, all equivalent modifications or changes made by those of ordinary skill in the technical field to which they belong, without departing from the spirit and technical concept disclosed by the present invention should still be covered by the claims of the present invention.

What is claimed is:

1. A method for manufacturing a 14 nm-node BEOL 32 nm-width metal, at least comprising the following steps:
    step 1, providing a semiconductor structure for manufacturing a BEOL metal wire, wherein the semiconductor structure at least comprises a carbon coating, an intermediate layer on the carbon coating, and a laminated structure under the carbon coating, wherein the laminated structure comprises, from bottom to top, a carbon-containing silicon nitride layer, a first nitrogen-free anti-reflection coating, a TiN layer, and a second nitrogen-free anti-reflection coating;
    step 2, forming a photoresist layer on the intermediate layer and exposing the photoresist layer according to a layout;
    step 3, developing the exposed photoresist layer by using a developing solution, and causing the developed photoresist to react with the intermediate layer in a contact region of the developed photoresist to form a peg groove, the peg groove comprising a narrow portion having a width of 53 nm and a wide portion having a width of 59 nm; and
    step 4, etching by using the peg groove in the semiconductor structure to form a 14 nm-node BEOL 32 nm-width metal.

2. The method for manufacturing the 14 nm-node BEOL 32 nm-width metal according to claim 1, wherein a thickness of the carbon coating is 1800 angstroms.

3. The method for manufacturing the 14 nm-node BEOL 32 nm-width metal according to claim 1, wherein a thickness of the carbon-containing silicon nitride layer is 100 angstroms.

4. The method for manufacturing the 14 nm-node BEOL 32 nm-width metal according to claim 1, wherein a thickness of the first nitrogen-free anti-reflection coating is 200 angstroms.

5. The method for manufacturing the 14 nm-node BEOL 32 nm-width metal according to claim 1, wherein a thickness of the TiN layer is 250 angstroms.

6. The method for manufacturing the 14 nm-node BEOL 32 nm-width metal according to claim 1, wherein a thickness of the second nitrogen-free anti-reflection coating is 400 angstroms.

7. The method for manufacturing the 14 nm-node BEOL 32 nm-width metal according to claim 1, wherein the etching by using the peg groove in the semiconductor structure to form the 14 nm-node BEOL 32 nm-width metal at least comprises: (a) etching the intermediate layer according to a width of a bottom of the intermediate layer, so that a width of exposed carbon coating reaches 32 nm; and (b) etching the laminated structure along the exposed carbon coating to form a 32 nm groove.

8. The method for manufacturing the 14 nm-node BEOL 32 nm-width metal according to claim 1, wherein the intermediate layer in step 1 is a bottom anti-reflection layer.

9. The method for manufacturing the 14 nm-node BEOL 32 nm-width metal according to claim 8, wherein a thickness of the bottom anti-reflection layer is 330 angstroms.

10. The method for manufacturing the 14 nm-node BEOL 32 nm-width metal according to claim 1, wherein a thickness of the photoresist layer formed on the intermediate layer in step 2 is 750 angstroms.

\* \* \* \* \*